US009705065B2

(12) United States Patent
Lee et al.

(10) Patent No.: US 9,705,065 B2
(45) Date of Patent: Jul. 11, 2017

(54) PIEZOELECTRIC ACTUATOR

(71) Applicant: SAMSUNG ELECTRO-MECHANICS CO., LTD., Suwon, Gyunggi-do (KR)

(72) Inventors: Tae Kyung Lee, Gyunggi-do (KR); Byung Hun Kim, Gyunggi-do (KR); Hwa Sun Lee, Gyunggi-do (KR); Jae Chang Lee, Gyunggi-do (KR); Seung Mo Lim, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 431 days.

(21) Appl. No.: 14/169,915

(22) Filed: Jan. 31, 2014

(65) Prior Publication Data

US 2015/0145380 A1    May 28, 2015

(30) Foreign Application Priority Data

Nov. 25, 2013  (KR) .................. 10-2013-0143775

(51) Int. Cl.
| | | |
|---|---|---|
| *H01L 41/04* | (2006.01) | |
| *H01L 41/047* | (2006.01) | |
| *H01L 41/09* | (2006.01) | |

(52) U.S. Cl.
CPC ...... *H01L 41/0471* (2013.01); *H01L 41/0973* (2013.01)

(58) Field of Classification Search
CPC ...... H01L 41/0471; H01L 41/047; H02N 2/00

USPC ....... 310/365, 346, 320, 321, 322, 324, 311, 310/335, 360.363, 366, 364, 328, 359
See application file for complete search history.

(56) References Cited

U.S. PATENT DOCUMENTS

| | | | | |
|---|---|---|---|---|
| 5,903,087 | A * | 5/1999 | Mattson | H03H 9/132 310/327 |
| 6,714,102 | B2 * | 3/2004 | Ruby | H03H 3/02 181/293 |
| 7,265,481 | B2 * | 9/2007 | Chang | B41J 2/14233 310/330 |
| 7,902,721 | B2 * | 3/2011 | Maeda | H03H 9/132 310/312 |
| 2007/0120447 | A1 | 5/2007 | Umemiya et al. | |
| 2009/0026887 | A1 * | 1/2009 | Fujii | B41J 2/14233 310/330 |
| 2010/0123370 | A1 * | 5/2010 | Yamaguchi | H01L 41/1878 310/365 |
| 2013/0093291 | A1 * | 4/2013 | Goto | G01N 29/12 310/365 |

FOREIGN PATENT DOCUMENTS

| | | | |
|---|---|---|---|
| JP | 2007142209 A | | 6/2007 |
| JP | 2007-208771 | * | 8/2007 |

* cited by examiner

*Primary Examiner* — Thomas Dougherty
*Assistant Examiner* — Karen B Addison
(74) *Attorney, Agent, or Firm* — NSIP Law

(57) ABSTRACT

There is provided a piezoelectric actuator including: a piezoelectric member having a multilayer structure; an external electrode formed on an outer surface of the piezoelectric member; and an intermediate electrode formed between layers of the piezoelectric members and having an area smaller than that of the external electrode.

17 Claims, 11 Drawing Sheets

| | Electrode area | Electrode area ratio | Displacement(nm) | Displacement ratio | Displacement ratio /Electrode area ratio |
|---|---|---|---|---|---|
| Ref. | 9000 | 1.00 | 125 | 1.00 | 1.00 |
| Curvy edge | 8686 | 0.97 | 202 | 1.62 | 1.67 |
| Hole | 6312.16 | 0.70 | 101 | 0.81 | 1.15 |
| Stripe | 5400 | 0.60 | 45 | 0.36 | 0.60 |

C - C'

D – D'

| Electrode width (um) | Electrode length (um) | Chamber width (um) | Electrode width /Chamber width | Electrode area | Electrode area ratio | Displacement (nm) | Displacement ratio | Displacement ratio /Electrode area ratio |
|---|---|---|---|---|---|---|---|---|
| 60 | 150 | 55 | 1.09 | 9000 | 1.00 | 127 | 1.00 | 1.00 |
| 40 | 150 | 55 | 0.73 | 6000 | 0.67 | 226 | 1.78 | 2.67 |
| 30 | 150 | 55 | 0.55 | 4500 | 0.50 | 236 | 1.86 | 3.72 |
| 20 | 150 | 55 | 0.36 | 3000 | 0.33 | 207 | 1.63 | 4.89 |
| 10 | 150 | 55 | 0.18 | 1500 | 0.17 | 94 | 0.74 | 4.44 |

FIG. 14

PIEZOELECTRIC ACTUATOR

CROSS-REFERENCE TO RELATED APPLICATION

This application claims the benefit of Korean Patent Application No. 10-2013-0143775 filed on Nov. 25, 2013, with the Korean Intellectual Property Office, the disclosure of which is incorporated herein by reference.

BACKGROUND

The present disclosure relates to a piezoelectric actuator using a piezoelectric element.

Recently, mobile communications terminal functions have been diversified. Therefore, various sensors and actuators have been mounted in mobile communications terminals. As an example of such a sensor, an angular velocity sensor using a piezoelectric element is provided.

Meanwhile, sizes of the sensor and the actuator have decreased in accordance with the multifunctionalization and thinning of mobile communications terminals. However, in this case, since a size or an area of the piezoelectric element may be decreased, sensitivity of the sensor and driving force of the actuator may be decreased. Therefore, there is a need to develop an actuator having a structure that does not decrease the sensitivity of the sensor and the driving force of the actuator.

For reference, Patent Documents 1 and 2 disclose a piezoelectric actuator according to the related art.

RELATED ART DOCUMENT (Patent Document 1) US2007-120447 A
(Patent Document 2) JP2007-142209 A

SUMMARY

An aspect of the present disclosure may provide a piezoelectric actuator having a structure capable of improving displacement characteristics.

According to an aspect of the present disclosure, a piezoelectric actuator may include: a piezoelectric member having a multilayer structure; an external electrode formed on an outer surface of the piezoelectric member; and an intermediate electrode formed between layers of the piezoelectric members and having an area smaller than that of the external electrode.

The external electrode and the intermediate electrode may be extended in a length direction of the piezoelectric member.

The intermediate electrode may have a width partially narrower than that of the external electrode.

The intermediate electrode may have a shape in which a width thereof is repeatedly increased and decreased in a length direction of the piezoelectric member.

The intermediate electrode may have a waveform or sawtooth shape.

The intermediate electrode may have a horizontally symmetrical shape based on a bisector in the length direction of the piezoelectric member.

The intermediate electrode may have a shape in which it is extended at a constant width in a length direction of the piezoelectric member.

A narrowest width of the intermediate electrode may be 0.3 to 0.7 times that of the width of the piezoelectric member.

According to another aspect of the present disclosure, a piezoelectric actuator may include: a piezoelectric member having a multilayer structure; an external electrode formed on an outer surface of the piezoelectric member; a first intermediate electrode formed between a first layer and a second layer of the piezoelectric member and having an area smaller than that of the external electrode; and a second intermediate electrode formed between the second layer and a third layer of the piezoelectric member and having an area smaller than that of the external electrode.

Each of the first intermediate electrode and the second intermediate electrode may be extended in a length direction of the piezoelectric member.

Each of the first intermediate electrode and the second intermediate electrode may have a width partially narrower than that of the external electrode.

Each of the first intermediate electrode and the second intermediate electrode may have a shape in which a width thereof is repeatedly increased and decreased in a length direction of the piezoelectric member.

Each of the first intermediate electrode and the second intermediate electrode may have a waveform or sawtooth shape.

Each of the first intermediate electrode and the second intermediate electrode may have a horizontally symmetrical shape based on a bisector in the length direction of the piezoelectric member.

Each of the first intermediate electrode and the second intermediate electrode may have a shape in which it is extended at a constant width in a length direction of the piezoelectric member.

A narrowest width of each of the first intermediate electrode and the second intermediate electrode may be 0.3 to 0.7 times that of the width of the piezoelectric member.

The first intermediate electrode and the second intermediate electrode may have different shapes.

According to another aspect of the present disclosure, a piezoelectric actuator may include: a thin film member covering one surface of a pressure chamber; a piezoelectric member formed on the thin film member and having a multilayer structure; an external electrode formed on an outer surface of the piezoelectric member; and an intermediate electrode formed between layers of the piezoelectric members and having an area smaller than that of the external electrode.

The external electrode and the intermediate electrode may be extended in a length direction of the piezoelectric member.

The intermediate electrode may have a width partially narrower than that of the pressure chamber.

The intermediate electrode may have a shape in which a width thereof is repeatedly increased and decreased in a length direction of the piezoelectric member.

The intermediate electrode may have a waveform or sawtooth shape.

The intermediate electrode may have a horizontally symmetrical shape based on a bisector in a length direction of the pressure chamber.

The intermediate electrode may have a shape in which it is extended at a constant width in a length direction of the pressure chamber.

A narrowest width of the intermediate electrode may be 0.3 to 0.7 times that of the width of the pressure chamber.

According to another aspect of the present disclosure, a piezoelectric actuator may include: a first piezoelectric layer; an electrode layer formed on the first piezoelectric layer and having a width narrower than that of the first piezoelectric layer; and a second piezoelectric layer formed on the first piezoelectric layer and accommodating the electrode layer therein, wherein the second piezoelectric layer has a bent part formed so as to correspond to the electrode layer.

According to another aspect of the present disclosure, a piezoelectric actuator may include: a first piezoelectric layer; a second piezoelectric layer formed on the first piezoelectric layer; and an electrode layer formed between the first piezoelectric layer and the second piezoelectric layer and having a width narrower than that of the second piezoelectric layer, wherein the second piezoelectric layer includes a protrusion part protruding toward the first piezoelectric layer having a shape corresponding to that of the electrode layer.

BRIEF DESCRIPTION OF DRAWINGS

The above and other aspects, features and other advantages of the present disclosure will be more clearly understood from the following detailed description taken in conjunction with the accompanying drawings, in which:

FIG. 14 is a table showing displacement characteristics depending on a ratio between a pressure chamber width and an intermediate electrode width.

DETAILED DESCRIPTION

Figure 1:
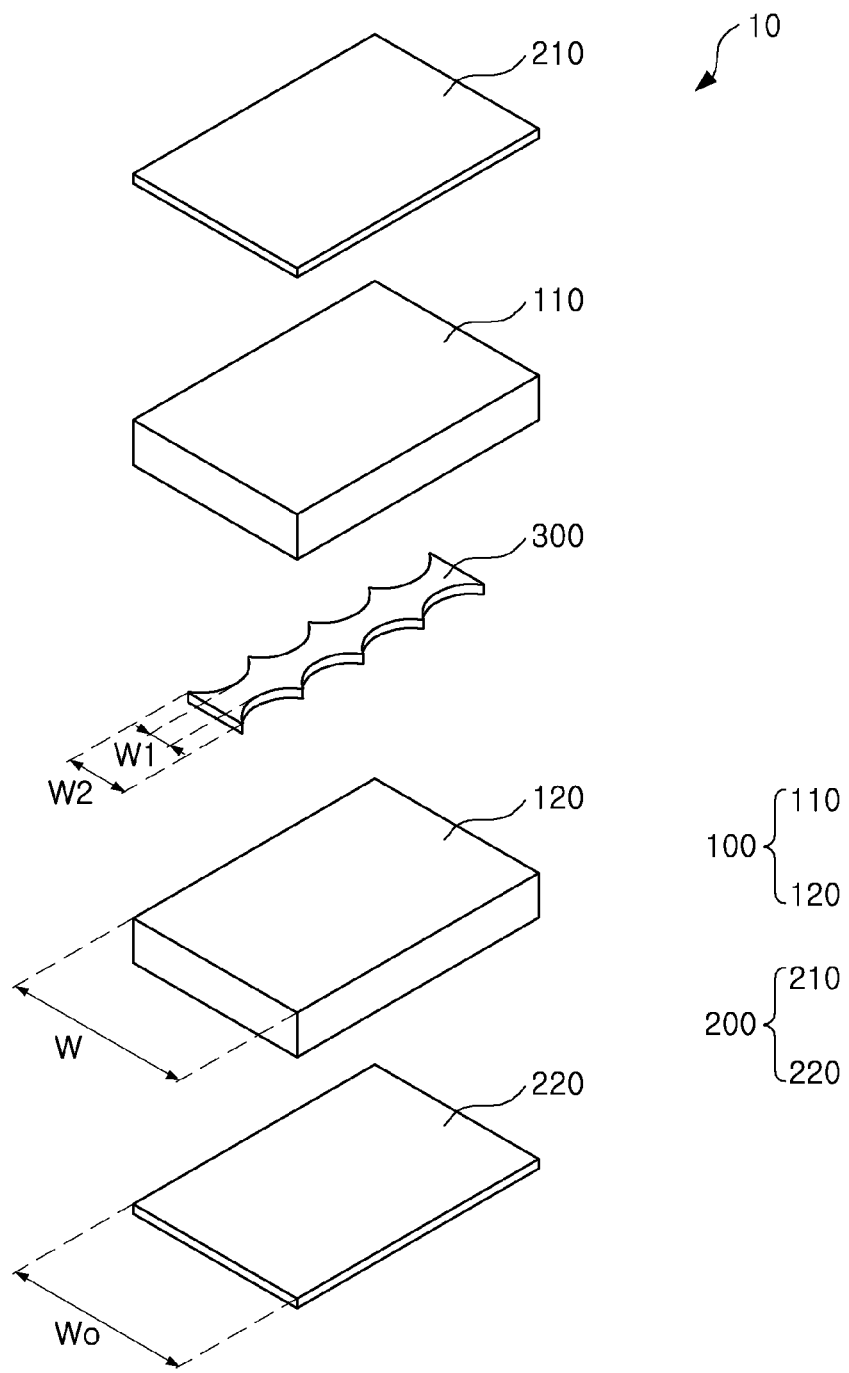
FIG. 1 is an exploded perspective view of a piezoelectric actuator according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 3:
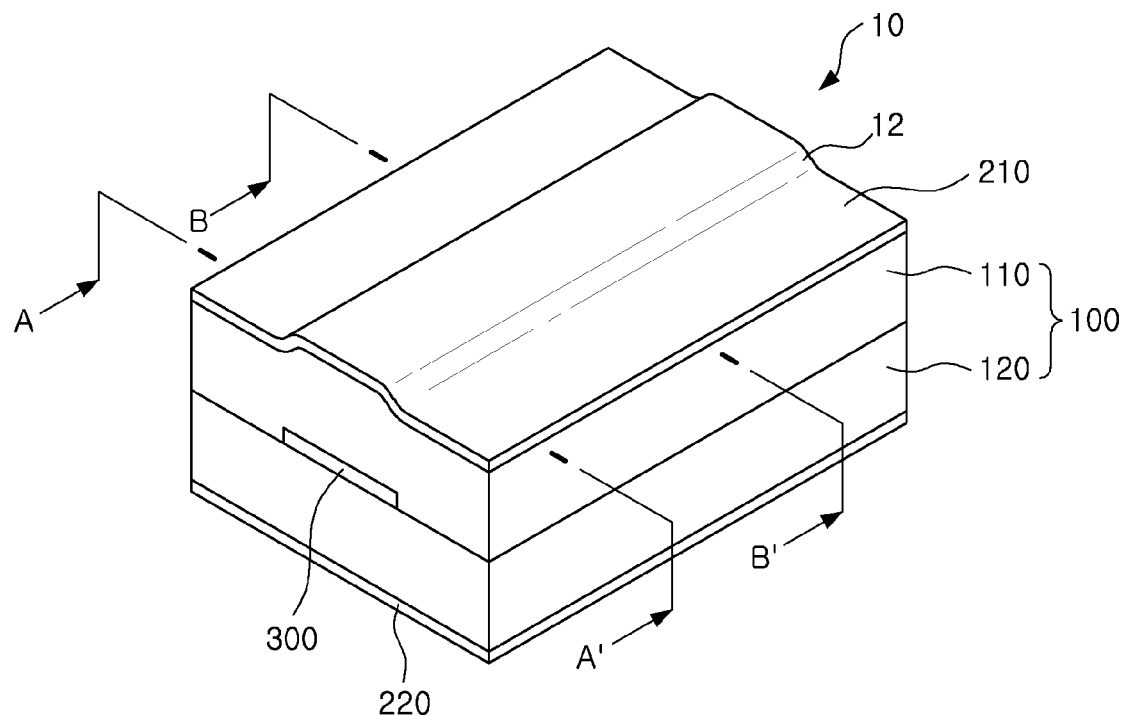
FIG. 3 is an assembled perspective view of the piezoelectric actuator shown in FIG. 1.
Figure 4:
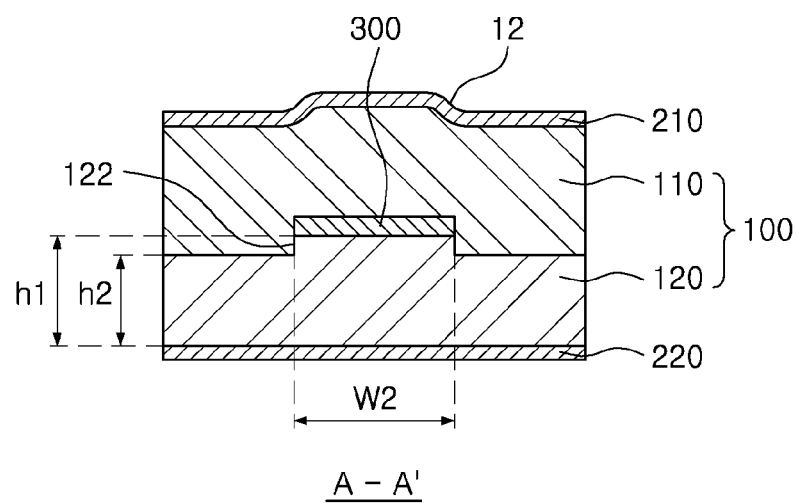
FIG. 4 is a cross-sectional view of the piezoelectric actuator taken along line A-A of in FIG. 3.
Figures 5, 6:
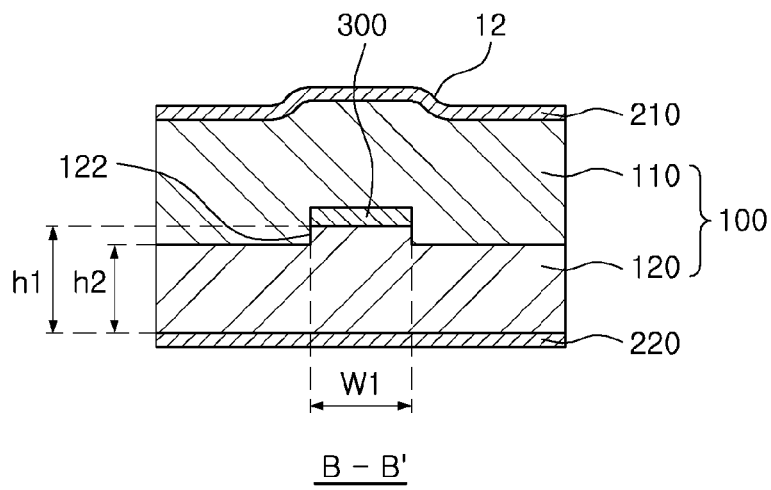
FIG. 5 is a cross-sectional view of the piezoelectric actuator taken along line B-B of in FIG. 3.
FIG. 6 is a table showing displacement characteristics depending on a shape of an intermediate electrode.
Figure 7:
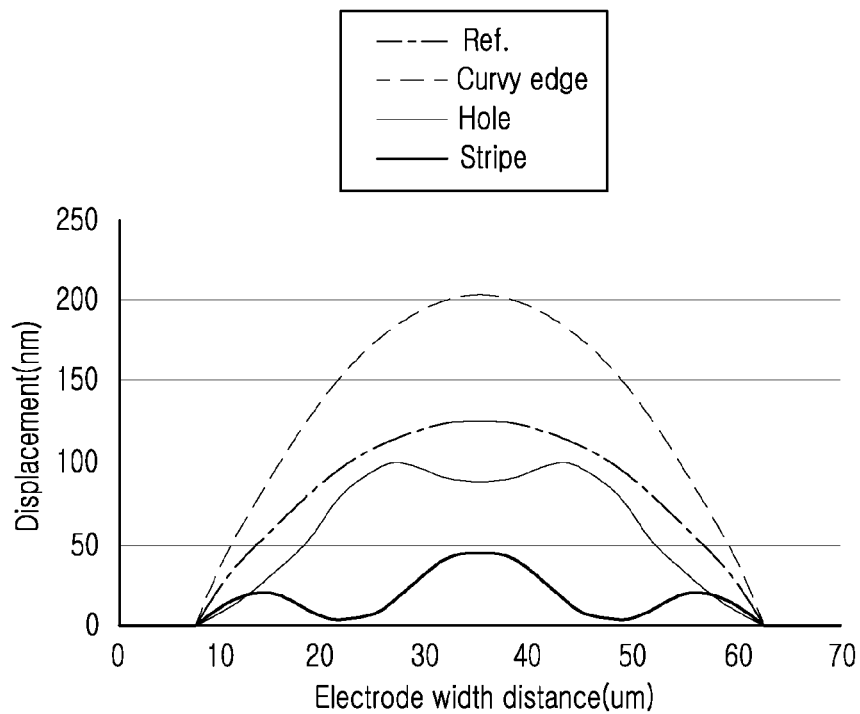
FIGS. 7 and 8 are graphs showing displacement characteristics according to a shape of an intermediate electrode.
Figure 8:
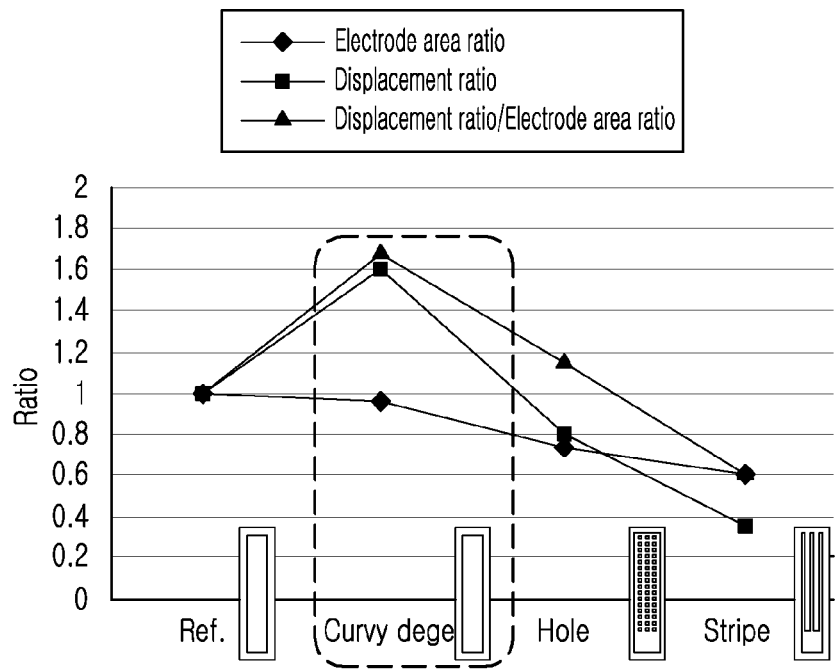
Figure 9:
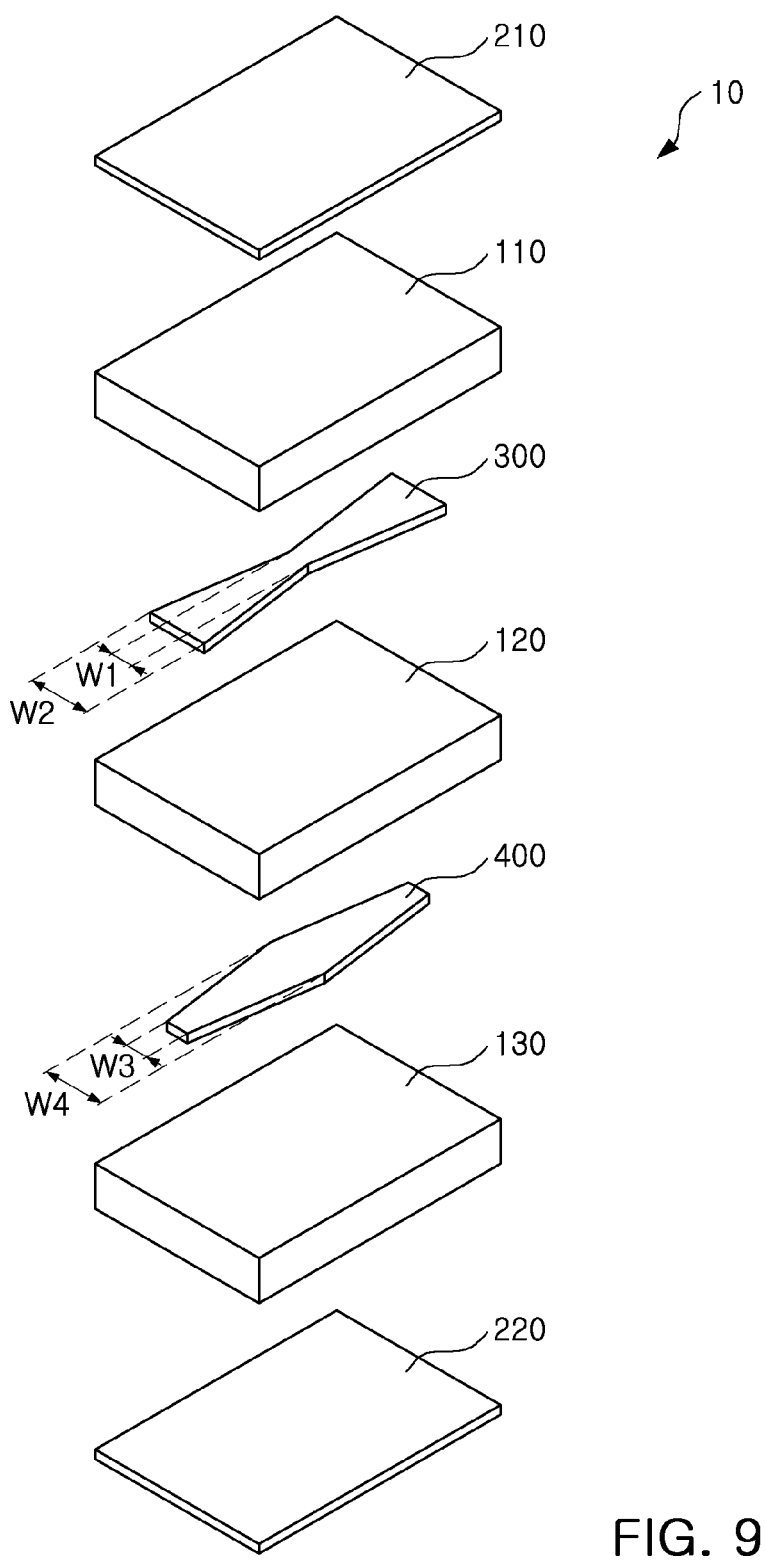
FIG. 9 is an exploded perspective view of a piezoelectric actuator according to another exemplary embodiment of the present disclosure.
Figure 10:
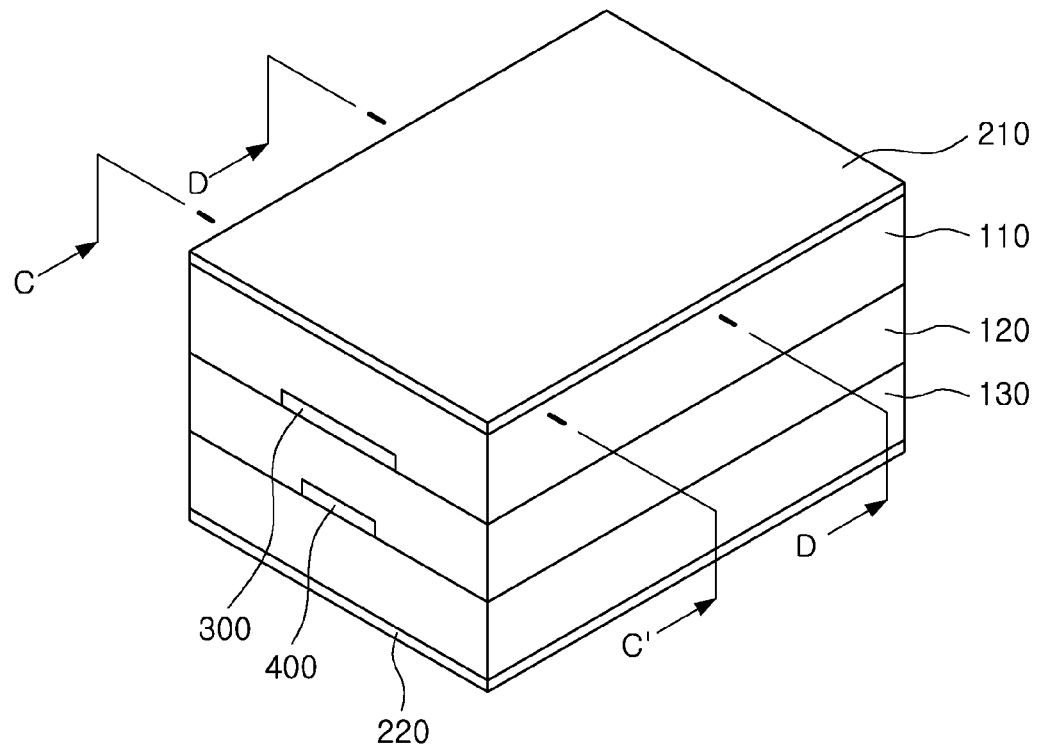
FIG. 10 is an assembled perspective view of the piezoelectric actuator shown in FIG. 9.
Figure 11:
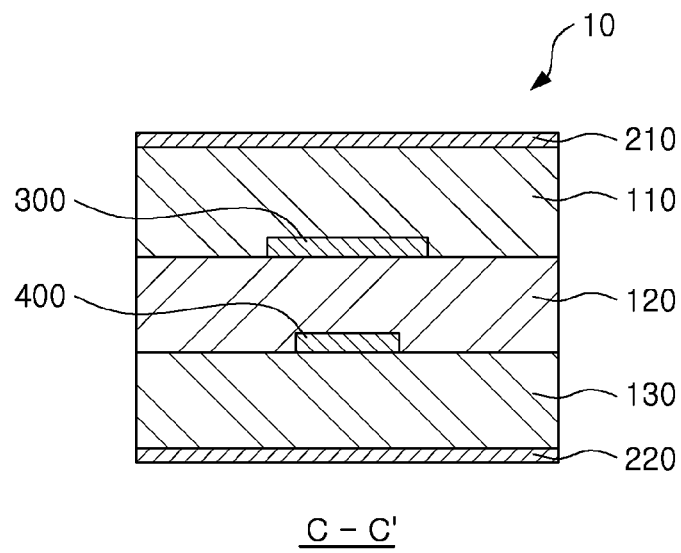
FIG. 11 is a cross-sectional view of the piezoelectric actuator take along line C-C of FIG. 10.
Figure 12:
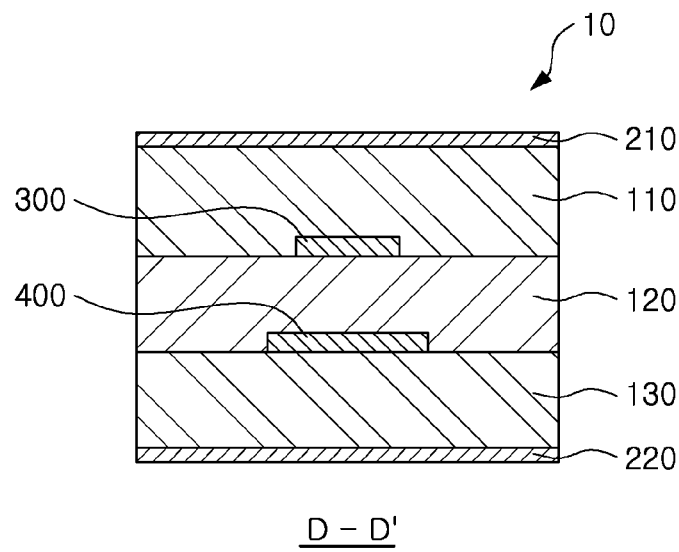
FIG. 12 is a cross-sectional view of the piezoelectric actuator taken along line D-D of in FIG. 10.
Figure 13:
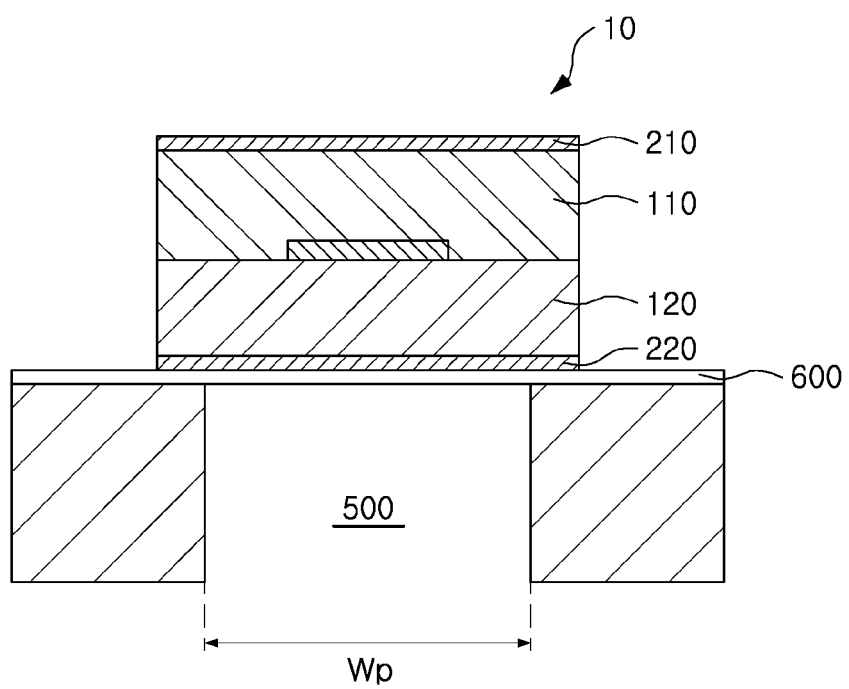
FIG. 13 is a cross-sectional view of a piezoelectric actuator according to another exemplary embodiment of the present disclosure.
Figure 15:
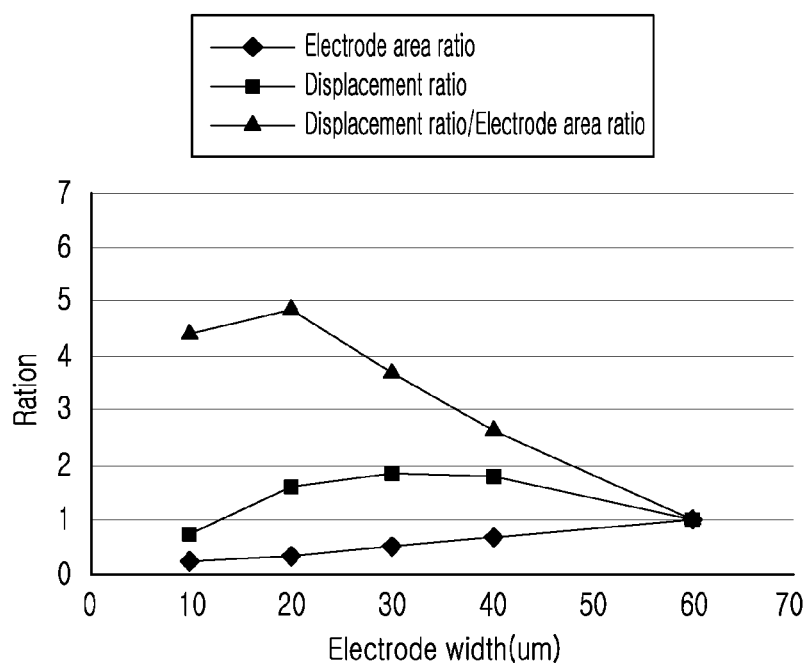
FIGS. 15 through 17 are graphs showing displacement characteristics depending on a ratio between a pressure chamber width and an intermediate electrode width.
Figure 16:
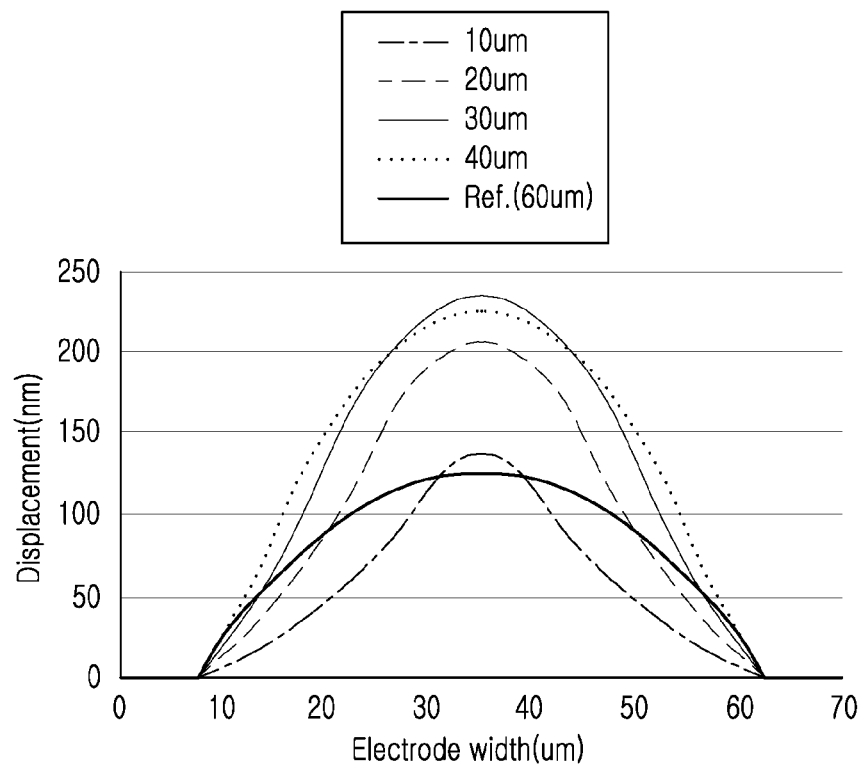
Figure 17:
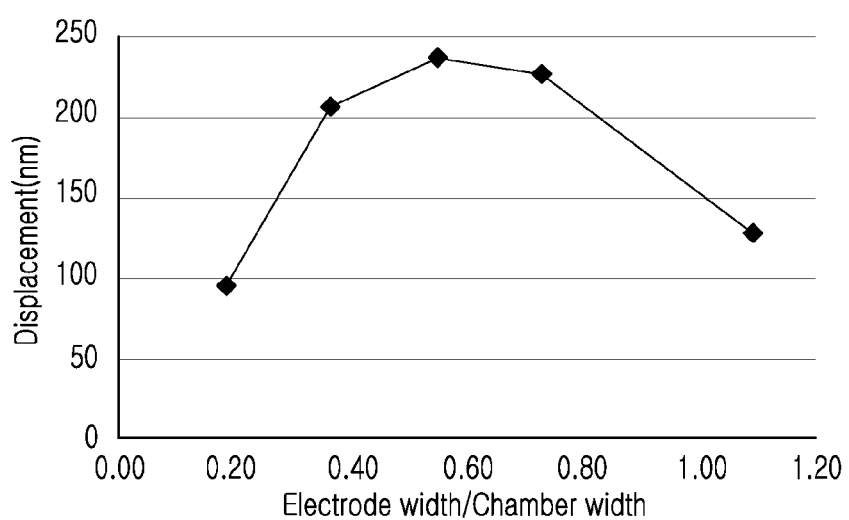

FIG. 1 is an exploded perspective view of a piezoelectric actuator according to an exemplary embodiment of the present disclosure; FIGS. 2A through 2E are plan views showing other shapes of an intermediate electrode shown in FIG. 1; FIG. 3 is an assembled perspective view of the piezoelectric actuator shown in FIG. 1; FIG. 4 is a cross-sectional view of the piezoelectric actuator taken along line A-A of in FIG. 3; FIG. 5 is a cross-sectional view of the piezoelectric actuator taken along line B-B of in FIG. 3; FIG. 6 is a table showing displacement characteristics depending on a shape of an intermediate electrode; FIGS. 7 and 8 are graphs showing displacement characteristics according to a shape of an intermediate electrode; FIG. 9 is an exploded perspective view of a piezoelectric actuator according to another exemplary embodiment of the present disclosure; FIG. 10 is an assembled perspective view of the piezoelectric actuator shown in FIG. 9; FIG. 11 is a cross-sectional view of the piezoelectric actuator take along line C-C of FIG. 10; FIG. 12 is a cross-sectional view of the piezoelectric actuator taken along line D-D of in FIG. 10; FIG. 13 is a cross-sectional view of a piezoelectric actuator according to another exemplary embodiment of the present disclosure; FIG. 14 is a table showing displacement characteristics depending on a ratio between a pressure chamber width and an intermediate electrode width; and FIGS. 15 through 17 are graphs showing displacement characteristics depending on a ratio between a pressure chamber width and an intermediate electrode width.

A piezoelectric actuator according to an exemplary embodiment of the present disclosure will be described with reference to FIGS. 1 through 9.

A piezoelectric actuator 10 according to an exemplary embodiment of the present disclosure may include a piezoelectric member 100, an external electrode 200, and an intermediate electrode 300. In addition, the piezoelectric actuator 10 may further include one or more connection electrodes (not shown) connected to the external electrode 200 and the intermediate electrode 300, respectively. Here, one of the connection electrodes may be formed integrally with the external electrode 200. Alternatively, the connection electrode may have a bonding wire shape. However, the connection electrode is not limited to having the above-mentioned shape. Therefore, the connection electrode may have any shape as long as it may supply current to the external electrode 200 and the intermediate electrode 300.

The piezoelectric member 100 may be formed of a ceramic material. For example, the piezoelectric member 100 may be formed of lead zirconate titanate (PZT). However, a material used for the piezoelectric member 100 is not limited to PZT. For example, the piezoelectric member 100 may also be formed of a ceramic material having piezoelectric or pyroelectric characteristics.

The piezoelectric member 100 may include a plurality of layers. For example, the piezoelectric member 100 may include a first piezoelectric layer 110 and a second piezoelectric layer 120. However, the number of piezoelectric layers included in the piezoelectric member 100 is not limited to two. For example, the piezoelectric member 100 may also include three or more piezoelectric layers.

The first piezoelectric layer 110 and the second piezoelectric layer 120 may have a substantially rectangular parallelepiped shape. The first piezoelectric layer 110 and the second piezoelectric layer 120 may generally have a shape in which they are extended lengthwise in one direction. In addition, the first piezoelectric layer 110 and the second piezoelectric layer 120 may have substantially the same size and shape. For example, a width, a length, and a height of the first piezoelectric layer 110 may be substantially the same as those of the second piezoelectric layer 120. However, the first and second piezoelectric layers 110 and 120 do not necessarily have the same width, length, and height. For reference, although the case in which the first piezoelectric layer 110 is formed on the second piezoelectric layer 120 has been shown in the accompanying drawings, the second piezoelectric layer 120 may be formed on the first piezoelectric layer 110 if necessary.

The external electrode 200 may be formed on the piezoelectric member 100. For example, the external electrode 200 may be formed on an outer surface of the piezoelectric member 100. In addition, the external electrode 200 may have substantially the same width as that of the piezoelectric member 100. For example, a width Wo of the external electrode 200 may be same as wideness W of the piezoelectric member 100. However, the width Wo of the external electrode 200 is not necessarily same as wideness W of the piezoelectric member 100. For example, the width Wo of the external electrode 200 may be narrower than wideness W of the piezoelectric member 100.

The external electrode 200 may include a plurality of electrodes. For example, the external electrode 20 may include a first external electrode 210 and a second external electrode 220. Here, the first external electrode 210 may be formed on one surface (upper surface based on FIG. 1) of the first piezoelectric layer 110, and the second external electrode 220 may be formed on one surface (lower surface based on FIG. 1) of the second piezoelectric layer 120. In addition, the first and second external electrodes 210 and 220 may have the same polarity. For example, both of the first and second external electrodes 210 and 220 may have a first polarity. In addition, the first and second external electrodes 210 and 220 may receive a current signal having the same magnitude. For example, the first and second external electrodes 210 and 220 may receive a current signal having a first magnitude. However, the first and second external electrodes 210 and 220 do not necessarily receive the current signal having the same magnitude. For example, the first and second external electrodes 210 and 220 may also receive current signals having different magnitudes.

The intermediate electrode 300 may be formed in the piezoelectric member 100. For example, the intermediate electrode 300 may be formed between the first and second piezoelectric layers 110 and 120. The intermediate electrode 300 may have a polarity different from that of the external electrode 200. For example, the intermediate electrode 300 may have a second polarity different from that of the first and second external electrodes 210 and 220. Therefore, the intermediate electrode 300 may be used as a common electrode for the first and second external electrodes 210 and 220. As an example, the first external electrode 210 and the intermediate electrode 300 may form one circuit, and the second external electrode 220 and the intermediate electrode 300 may form another circuit.

The intermediate electrode 300 may have an area smaller from that of the external electrode 200. For example, widths W1 and W2 of the intermediate electrode 300 may be smaller than that Wo of the external electrode 200. In addition, the intermediate electrode 300 may have a shape in which a width thereof is repeatedly increased and decreased in a length direction thereof. For example, the intermediate electrode 300 may have a shape in which the narrowest width W1 and the largest width W2 thereof are repeated. Here, the narrowest width W1 and the largest width W2 of the intermediate electrode 300 may be smaller than that Wo of the external electrode 200 or wideness W of the piezoelectric member 100. For example, the narrowest width W1 of the intermediate electrode 300 may be 0.3 to 0.7 times that of the width Wo of the external electrode 200 or the width W of the piezoelectric member 100. The intermediate electrode 300 formed as described above may effectively increase a displacement width of the piezoelectric member 100.

Figure 2A:
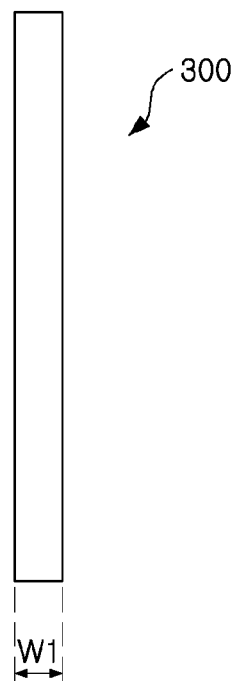
FIGS. 2A through 2E are plan views showing shapes of an intermediate electrode shown in FIG. 1.
Figure 2B:
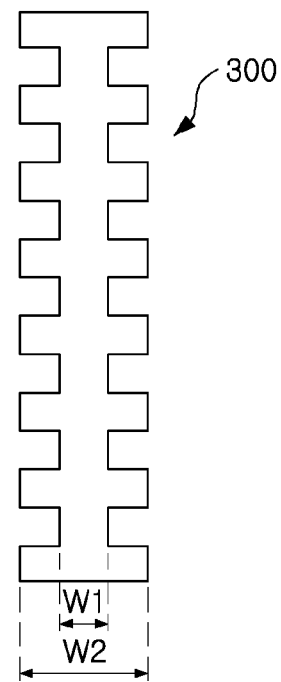
Figure 2C:
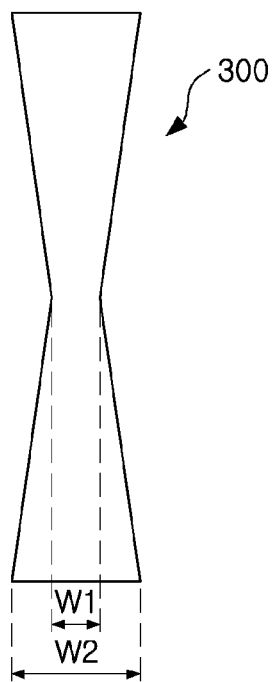
Figure 2D:
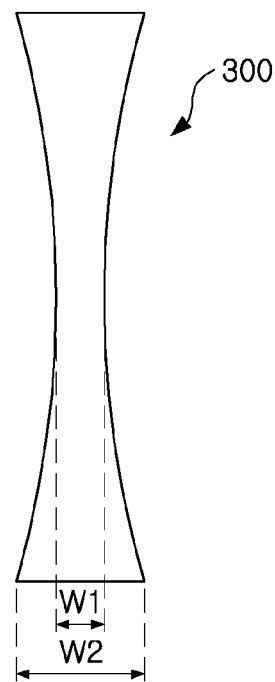
Figure 2E:
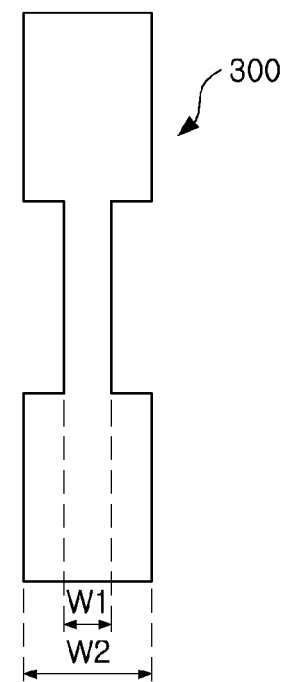

Meanwhile, the intermediate electrode 300 may have various shapes as shown in FIGS. 2A through 2E. As an example, the intermediate electrode 300 may have a band shape in which a width W1 thereof is constant, as shown in FIG. 2A. Here, the width W1 may satisfy the narrowest width condition ($0.3*W \leq W1 \leq 0.7*W$) of the intermediate electrode 300. As another example, the intermediate electrode 300 may have a sawtooth shape in which the narrowest width W1 and the largest width W2 are repeated, as shown in FIG. 2B. As another example, the intermediate electrode 300 may have a shape in which a width thereof is changed from both end portions thereof toward a central portion thereof, as shown in FIGS. 2C and 2D. Here, the central portion of the intermediate electrode 300 may have the narrowest width W1 and both end portions thereof may have the largest width W2. As another example, the intermediate electrode 300 may have a shape in which rectangles having partially different widths are connected to each other, as shown in FIG. 2E. For example, a central portion of the intermediate electrode 300 may have a rectangular shape having a first width W1 and both end portions of the intermediate electrode 300 may have a rectangular shape having a second width W2.

The piezoelectric actuator 10 configured as described above may have a substantially rectangular parallelepiped shape, as shown in FIG. 3. In addition, the piezoelectric actuator 10 may have a shape in which it includes a bent part 12 formed in one portion thereof. For example, the piezoelectric actuator 10 may have the bent part 12 on an upper surface (based on FIG. 3) thereof, wherein the bent part 12 protrudes upwardly by an amount equal to a thickness of the intermediate electrode 300.

In addition, the piezoelectric actuator 10 may have different shapes depending on a cut-away cross section, as shown in FIGS. 4 and 5. For example, the intermediate electrode 300 may have the narrowest width W1 at one portion of the piezoelectric actuator 10 and may have the largest width W2 at another portion thereof.

In addition, the piezoelectric actuator 10 may include a protrusion part 122 formed on a boundary surface between the first and second piezoelectric layers 110 and 120. For example, the second piezoelectric layer 120 may have the protrusion part 122 formed at a portion thereof corresponding to the intermediate electrode 300. The protrusion part 122 may have a shape in which it protrudes from the second piezoelectric layer 120 toward the first piezoelectric layer 110. Therefore, a height h1 from one surface (lower surface based on FIG. 4) of the second piezoelectric layer 120 up to the intermediate electrode 300 may be larger than that h2 of one surface (lower surface based on FIG. 4) of the second piezoelectric layer 120 up to the boundary surface between the first and second piezoelectric layers 110 and 120.

For reference, although the case in which the protrusion part 122 is formed on the second piezoelectric layer 120 has been described in the present specification, the protrusion part 122 is not limited to being formed on the second piezoelectric layer 120. For example, in the case in which the piezoelectric actuator 10 is manufactured in a sequence of the first piezoelectric layer 100, the intermediate electrode 300, and the second piezoelectric layer 120, the protrusion part may be formed on the first piezoelectric layer 110. In addition, the protrusion part of the piezoelectric layers 110 and 120 may be formed in a process of forming the intermediate electrode 300 between the piezoelectric layers 110 and 120. For example, the protrusion part may be formed in a process of forming a photoresist (PR) pattern for forming the intermediate electrode 300 and developing and etching the PR pattern. However, the protrusion part is not limited to being formed by the above-mentioned process, but may also be formed using another process.

The piezoelectric actuator 10 configured as described above may have displacement values shown in FIGS. 6 through 8. For example, in FIG. 6, an example represented by Ref. may indicate a form in which widths of an intermediate electrode and an external electrode are the same as each other, an example represented by Curvy edge may indicate a form in which it has an intermediate electrode that is same as or similar to Inventive Example, an example represented by Hole may indicate a form in which a plurality of holes are formed in an intermediate electrode, and an example represented by Stripe may indicate a form in which an intermediate electrode has a shape of a plurality of bands.

The piezoelectric actuator 10 according to the Inventive Example has shown a displacement value (1.62) relatively higher than those (1.00, 0.81, and 0.36) of Comparative Examples (See FIGS. 6 and 8). In addition, the piezoelectric actuator 10 according to Inventive Example has exhibited a substantially high displacement value even in a width direction of the intermediate electrode, as shown in FIG. 7. On the other hand, the Comparative Examples have exhibited substantially irregular and lower displacement values. This experiment may prove that the piezoelectric actuator 10 according to Inventive Example is advantageous for significantly increasing displacement characteristics.

Therefore, the piezoelectric actuator 10 according to Inventive Example may be useful for a device requiring a high degree of displacement. In addition, the piezoelectric actuator 10 according to the Inventive Example may be advantageous for a mobile communications terminal that needs to be miniaturized and thinned.

Next, a piezoelectric actuator according to another exemplary embodiment of the present disclosure will be described with reference to FIGS. 10 through 12.

A piezoelectric actuator 10 according to another exemplary embodiment of the present disclosure may be different from the piezoelectric actuator according to an exemplary embodiment of the present disclosure described above in that a piezoelectric member 100 includes three layers 110, 120, and 130. In addition, the piezoelectric actuator 10 according to another exemplary embodiment of the present disclosure may be different from the piezoelectric actuator according to an exemplary embodiment of the present disclosure described above in that it includes a plurality of intermediate electrodes 300 and 400.

Hereinafter, components different from those of an exemplary embodiment of the present disclosure described above will be described.

The piezoelectric member 100 may include three layers 110, 120, and 130. For example, the piezoelectric member 100 may include a first piezoelectric layer 110, a second piezoelectric layer 120, and a third piezoelectric layer 130. In addition, the piezoelectric member 100 may have a structure in which the piezoelectric layer 110, the second piezoelectric layer 120, and the third piezoelectric layer 130 are stacked. For example, the piezoelectric member 100 may have a form in which the first piezoelectric layer 110, the second piezoelectric layer 120, and the third piezoelectric layer 130 are sequentially stacked. For reference, although the case in which the first piezoelectric layer 110, the second piezoelectric layer 120, and the third piezoelectric layer 130 are sequentially stacked has been described in the present specification, the first piezoelectric layer 110 and the third piezoelectric layer 130 may be formed based on the second piezoelectric layer 120 regardless of a sequence, if necessary. In addition, although the case in which the piezoelectric member 100 includes three layers has been described and shown, the piezoelectric member 100 may also include four or more layers, if necessary.

The first piezoelectric layer 110, the second piezoelectric layer 120, and the third piezoelectric layer 130 may have the same width, length, and height. For example, the first piezoelectric layer 110, the second piezoelectric layer 120, and the third piezoelectric layer 130 may have substantially the same size. However, the piezoelectric member 100 may be configured so that at least one of a width, a length, and a height becomes sequentially greater from the first piezoelectric layer 110 toward the third piezoelectric layer 130, if necessary. For example, at least one of a width, a length, and a height of the third piezoelectric layer 130 may be larger than at least one of a width, a length, and a height of the first piezoelectric layer 110. Unlike this, at least one pair of the first piezoelectric layer 110, the second piezoelectric layer 120, and the third piezoelectric layer 130 may have substantially the same size. For example, the first piezoelectric layer 110 and the second piezoelectric layer 120 may have substantially the same size. However, sizes of the first piezoelectric layer 110, the second piezoelectric layer 120, and the third piezoelectric layer 130 are not limited thereto. For example, sizes of the first piezoelectric layer 110, the second piezoelectric layer 120, and the third piezoelectric layer 130 may be variously changed.

The intermediate electrodes 300 and 400 may be formed between the piezoelectric layers of the piezoelectric member 100, respectively. For example, a first intermediate electrode 300 may be formed between the first and second piezoelectric layers 110 and 120, and a second intermediate electrode 400 may be formed between the second and third piezoelectric layers 120 and 130. However, positions of the intermediate electrodes 300 and 400 are not limited thereto. For example, positions of the first intermediate electrode 300 and the second intermediate electrode 400 may also be exchanged.

The first and second intermediate electrodes 300 and 400 may have a shape in which widths thereof are gradually changed. For example, the first intermediate electrode 300 may have a shape in which a width thereof is gradually decreased from both end portions thereof to a central portion thereof, as shown in FIG. 9. Unlike this, the second intermediate electrode 400 may have a shape in which a width thereof is gradually increased from both end portions thereof toward a central portion thereof, as shown in FIG. 9. However, shapes of the first and second intermediate electrodes 300 and 400 are not limited thereto. For example, a shape of the first intermediate electrode 300 may be changed so as to be substantially the same as that of the second intermediate electrode 400 or a shape of the second intermediate electrode 400 may be changed so as to be substantially the same as that of the first intermediate electrode 300.

The piezoelectric actuator 10 according to another exemplary embodiment of the present disclosure may have a multilayer structure as shown in FIG. 10 in the state in which it is assembled. In addition, the piezoelectric actuator 10 according to another exemplary embodiment of the present disclosure may have different shapes in a cross section taken in a length direction thereof, as shown in FIGS. 11 and 12.

The piezoelectric actuator 10 configured as described above may be advantageous for a device requiring a large degree of displacement since it includes a plurality of piezoelectric layers and a plurality of intermediate electrodes. In addition, the actuator 10 according to another exemplary embodiment of the present disclosure may be advantageous for a device requiring precise displacement characteristics since various modifications and combinations of the intermediate electrodes are possible.

Next, a piezoelectric actuator according to another exemplary embodiment of the present disclosure will be described with reference to FIGS. 13 through 17.

A piezoelectric actuator 10 according to another exemplary embodiment of the present invention may be different from the actuators according to exemplary embodiments of the present invention described above in that it further includes a pressure chamber 500 and a thin film member 600.

The piezoelectric actuator 10 may include the pressure chamber 500 having a predetermined space. For example, the piezoelectric actuator 10 may include the pressure chamber 500, a space for storing a target to be driven. Here, the pressure chamber 500 may be used as a space in which gas or liquid is provided. In addition, the pressure chamber 500 may be a portion of a device in which the piezoelectric actuator 10 is mounted. For example, the pressure chamber 500 may be a portion of the device while being a portion of the piezoelectric actuator 10.

The piezoelectric actuator 10 may include the thin film member 600. For example, the thin film member 600 may be configured so as to cover an opened portion of the pressure chamber 500. In addition, the thin film member 600 may be configured so as to transfer driving force to the pressure chamber 500 by displacement of the piezoelectric member 100. For example, the thin film member 600 may vibrate at a predetermined amplitude in the state in which the piezoelectric actuator operates, thereby generating a pressure change in the pressure chamber 500.

The piezoelectric actuator 10 configured as described above may be advantageous for discharging the liquid stored in the pressure chamber 500 or vibrating the thin film member 600.

Meanwhile, in the piezoelectric actuator 10 configured as described above, an intermediate electrode 300 may have a width narrower than that of the pressure chamber 500. For example, the narrowest width W1 (See FIG. 1) of the intermediate electrode 300 may be 0.3 to 0.7 times that of the width Wp of the pressure chamber 500. Here, the above-mentioned numerical range may be advantageous for significantly increasing displacement of the piezoelectric actuator 10. As an example, in the case in which a width of the pressure chamber 500 is 55 μm as shown in FIGS. 14 through 16, when a width of the intermediate electrode 300 is 20 to 40 μm, an optimal displacement value was obtained. Therefore, it may be advantageous that a width of the intermediate width 300 is set to be 0.3 to 0.7 times that of the width of the pressure chamber 500.

As set forth above, according to exemplary embodiments of the present disclosure, displacement characteristics may be improved.

While exemplary embodiments have been shown and described above, it will be apparent to those skilled in the art that modifications and variations could be made without departing from the spirit and scope of the present disclosure as defined by the appended claims.

What is claimed is:

1. A piezoelectric actuator comprising:
   a piezoelectric member having a multilayer structure;
   an external electrode formed on an outer surface of the piezoelectric member; and
   an intermediate electrode formed between layers of the piezoelectric members and having an area smaller than that of the external electrode,
   wherein the intermediate electrode partially has a width narrower than that of the external electrode.

2. The piezoelectric actuator of claim 1, wherein the external electrode and the intermediate electrode are extended in a length direction of the piezoelectric member.

3. The piezoelectric actuator of claim 1, wherein the intermediate electrode has a shape in which a width thereof is repeatedly increased and decreased in a length direction of the piezoelectric member.

4. The piezoelectric actuator of claim 3, wherein the intermediate electrode has a waveform or sawtooth shape.

5. The piezoelectric actuator of claim 3, wherein the intermediate electrode has a horizontally symmetrical shape based on a bisector in the length direction of the piezoelectric member.

6. The piezoelectric actuator of claim 1, wherein a narrowest width of the intermediate electrode is 0.3 to 0.7 times that of the width of the piezoelectric member.

7. A piezoelectric actuator comprising:
   a piezoelectric member having a multilayer structure;
   an external electrode formed on an outer surface of the piezoelectric member;
   a first intermediate electrode formed between a first layer and a second layer of the piezoelectric member and having an area smaller than that of the external electrode; and
   a second intermediate electrode formed between the second layer and a third layer of the piezoelectric member and having an area smaller than that of the external electrode.

8. The piezoelectric actuator of claim 7, wherein each of the first intermediate electrode and the second intermediate electrode is extended in a length direction of the piezoelectric member.

9. The piezoelectric actuator of claim 7, wherein each of the first intermediate electrode and the second intermediate electrode partially has a width narrower than that of the external electrode.

10. The piezoelectric actuator of claim 7, wherein each of the first intermediate electrode and the second intermediate electrode has a shape in which a width thereof is repeatedly increased and decreased in a length direction of the piezoelectric member.

11. The piezoelectric actuator of claim 10, wherein each of the first intermediate electrode and the second intermediate electrode has a waveform or sawtooth shape.

12. The piezoelectric actuator of claim 10, wherein each of the first intermediate electrode and the second intermediate electrode has a horizontally symmetrical shape based on a bisector in the length direction of the piezoelectric member.

13. The piezoelectric actuator of claim 7, wherein each of the first intermediate electrode and the second intermediate electrode has a shape in which it is extended at a constant width in a length direction of the piezoelectric member.

14. The piezoelectric actuator of claim 7, wherein a narrowest width of each of the first intermediate electrode and the second intermediate electrode is 0.3 to 0.7 times that of the width of the piezoelectric member.

15. The piezoelectric actuator of claim 7, wherein the first intermediate electrode and the second intermediate electrode have different shapes.

16. A piezoelectric actuator comprising:
a first piezoelectric layer;
an electrode layer formed on the first piezoelectric layer and having a width narrower than that of the first piezoelectric layer; and
a second piezoelectric layer formed on the first piezoelectric layer and accommodating the electrode layer therein,
wherein the second piezoelectric layer has a bent part formed so as to correspond to the electrode layer.

17. A piezoelectric actuator comprising:
a first piezoelectric layer;
a second piezoelectric layer formed on the first piezoelectric layer; and
an electrode layer formed between the first piezoelectric layer and the second piezoelectric layer and having a width narrower than that of the second piezoelectric layer,
wherein the second piezoelectric layer includes a protrusion part protruding toward the first piezoelectric layer having a shape corresponding to that of the electrode layer.

* * * * *